United States Patent
Ajiki et al.

(10) Patent No.: US 8,258,528 B2
(45) Date of Patent: Sep. 4, 2012

(54) SEMICONDUCTOR LIGHT-EMITTING DEVICE

(75) Inventors: Shuichi Ajiki, Tokyo (JP); Yasuyuki Kawakami, Tokyo (JP); Tsutomu Akagi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 214 days.

(21) Appl. No.: 12/491,793

(22) Filed: Jun. 25, 2009

(65) Prior Publication Data

US 2009/0321770 A1    Dec. 31, 2009

(30) Foreign Application Priority Data

Jun. 25, 2008  (JP) ................................. 2008-165639

(51) Int. Cl.
*H01L 33/46* (2010.01)
*H01L 33/60* (2010.01)

(52) U.S. Cl. .................. 257/98; 257/100; 257/E23.129

(58) Field of Classification Search .......... 257/E23.129, 257/E33.062, E23.126, E23.123, E23.127, 257/81, E33.063–E33.068, E33.07–E33.072, 257/88–90, 784, 98–100; 313/503, 505; 438/29; 362/257–311.15

See application file for complete search history.

(56) References Cited

U.S. PATENT DOCUMENTS

| 6,791,116 B2* | 9/2004 | Hirano et al. ................... 257/79 |
| 7,521,728 B2* | 4/2009 | Andrews ....................... 257/100 |
| 2006/0061259 A1 | 3/2006 | Negley |
| 2008/0076316 A1 | 3/2008 | Negley |

FOREIGN PATENT DOCUMENTS

| EP | 1677366 A2 * | 7/2006 |
| JP | 62-186553 A | 8/1987 |
| JP | 2008-514027 A | 5/2008 |
| WO | WO2006/036251 A1 | 4/2006 |

* cited by examiner

*Primary Examiner* — Kiesha Bryant
*Assistant Examiner* — Abbigale Boyle
(74) *Attorney, Agent, or Firm* — Kenealy Vaidya LLP

(57) ABSTRACT

The disclosed subject matter includes reliable semiconductor light-emitting devices having a favorable light distribution using an LED chip, which can emit light having a different color as compared to that emitted directly by the LED chip. The semiconductor light-emitting device can include an LED chip having an electrode, a phosphor layer located on the LED chip except for the electrode, a bonding wire connected to the electrode, and a light-reflecting resin. The light-reflecting resin can be disposed on a light-emitting surface that is exposed around the electrode and on the electrode including the bonding wire, and can prevent the LED chip from exhibiting a leak of light that is not wavelength-converted via the phosphor layer, while increasing light that passes through the phosphor layer. In addition, the light-reflecting resin can protect the bonding wire from vibration, etc. Thus, the disclosed subject matter can provide reliable semiconductor light-emitting devices having high brightness without substantial color variability and that can emit various colored light(s).

20 Claims, 9 Drawing Sheets

Embodiment 1

Comparative Example 1

FIG. 8

|  | Embodimet 1 | Comparative Example 2 | Comparative Example 3 |
|---|---|---|---|
| Changing rate of luminous flux (Before coating) | −2.9% | −12.8% | −6.7% |

US 8,258,528 B2

SEMICONDUCTOR LIGHT-EMITTING DEVICE

This application claims the priority benefit under 35 U.S.C. §119 of Japanese Patent Application No. 2008-165639 filed on Jun. 25, 2008, which is hereby incorporated in its entirety by reference.

BACKGROUND

1. Field

The presently disclosed subject matter relates to semiconductor light-emitting devices including an LED chip, and more particularly to a reliable semiconductor light-emitting device having a favorable light distribution, which can emit a different colored light as compared to the light emitted by the LED chip.

2. Description of the Related Art

Semiconductor light-emitting devices using an LED chip as a light source have been developed, which can emit a different colored light from that of the LED chip in order to emit various colored lights. An example of such a semiconductor light-emitting device is disclosed in patent document No. 1 listed below and shown in FIG. 1. FIG. 1 shows a conventional semiconductor light-emitting device that is disclosed in Patent Document No. 1.

The conventional semiconductor light-emitting device can include: a semiconductor light-emitting chip 110 having top and bottom electrodes and a light-emitting surface 110a; an electrode pad 130 of the top electrode that is made by forming on an exposed portion 122 of the light-emitting surface 110a; a phosphor layer 120 including a transparent silicone and a phosphor that is formed on the light-emitting surface 110a except at the electrode pad 130; the bottom electrode of the semiconductor light-emitting chip 110 mounted on a die bonding pad; and the electrode pad 130 electrically connected to a bonding pad with a bonding wire 140.

In the above-described semiconductor light-emitting device, for example, when the semiconductor light-emitting chip 110 is a blue LED chip that emits a blue light, and the phosphor layer 120 is a yellow phosphor for converting blue light to a complementary yellow light, a part of the blue light emitted from the blue LED chip excites the phosphor layer 120 and converts it to yellow light, which can be mixed with other parts of the blue light emitted from the blue LED chip by means of additive color mixture. Thus, the conventional semiconductor light-emitting device can emit light having a white color tone.

FIG. 2 is a flow chart showing a manufacturing process for the conventional semiconductor light-emitting device that is disclosed in Patent Document No. 1. The process for manufacturing the conventional semiconductor light-emitting device includes: forming the phosphor layer 120 on the semiconductor light-emitting chip 110 (step 710); forming the exposed portion 122 on the semiconductor light-emitting chip 110 using photolithography (step 720); forming the electrode pad 130 on the exposed portion 122 of the light-emitting surface 110a (step 730); and bonding to the electrode pad 130 with the bonding wire 140 (step 740). In the above steps 710 and 720, the phosphor layer 120 can also be formed while allowing the exposed part 122 to expose the light-emitting surface 110a by a printing process.

However, the bonding wire 140 that is located on the semiconductor light-emitting chip 110 shown in Patent Document 1 may be peeled from the electrode pad 130 by vibration and shock. In order to prevent the bonding wire 140 from peeling from the electrode pad 130, it may be necessary in some cases to not have the phosphor layer 120 formed on the electrode pad 130. Therefore, a blue light (a blue light that is not wavelength-converted) that is not excited by the phosphor layer 120 at a portion close to the electrode pad 130 is directly emitted (hereinafter described as a leak of blue light) from the semiconductor light-emitting chip towards the outside. The leak of blue light may cause color variability in the color tone of light emitted from the semiconductor light-emitting chip 110.

A structure for preventing the bonding wire 140 from peeling from the electrode pad 130 by vibration and shock is disclosed in patent document No. 2 listed below. FIG. 3 is a cross-section view showing a conventional structure for protecting a bonding wire from vibration and shock. The conventional structure includes: circuit boards 206 and 207; a driving tape 205 located between the circuit boards 206, 207; a wire bonding pad 204; a bonding wire 203 bonded to the wire bonding pad 204; a soft molding material 202; and a hard molding material 201. However, the above structure does not prevent the leak of blue light because this conventional structure does not include a phosphor for converting a wavelength of light.

The above-referenced Patent Documents are listed below and are hereby incorporated with their English abstract in their entireties.

1. Patent document No. 1: Japanese Patent Application Laid Open JP2008-514027 (National Laid Open WO2006/036251: PCT/US2005/023874)
2. Patent document No. 2: Japanese Patent Application Laid Open S62-186553

The disclosed subject matter has been devised to consider the above and other problems, features, and characteristics. Thus, embodiments of the disclosed subject matter can include reliable semiconductor light-emitting devices using an LED chip which can be used under vibration and shock circumstances and which can emit a different colored light from that of the LED chip while preventing the leak of light from the LED chip device that is not wavelength-converted. The device can include a semiconductor white light-emitting device using a blue LED chip and can be configured to prevent the blue LED chip from leak of blue light and can also be configured to improve the brightness thereof.

SUMMARY

The presently disclosed subject matter has been devised in view of the above and other characteristics, desires, and problems in the conventional art, and to make certain changes to the existing semiconductor light-emitting devices. An aspect of the disclosed subject matter includes providing reliable semiconductor white light-emitting devices with a favorable light distribution using a blue LED chip and can be configured to prevent the blue LED chip from exhibiting leak of blue light, and which device can also be simple in its composition by using the semiconductor light-emitting device of the disclosed subject matter.

According to another aspect of the disclosed subject matter, a semiconductor light-emitting device can include: an LED chip including a light-emitting surface and a chip electrode, and the chip electrode located on the light-emitting surface thereof; a phosphor layer located on the light-emitting surface except for the chip electrode; a bonding wire connected to the chip electrode of the LED chip; and a light-reflecting resin disposed at least on the light-emitting surface exposed between the chip electrode and the phosphor layer, as viewed from a light emitting direction of the device. The light emitting direction being a direction substantially perpendicular to a top surface of the light emitting surface, and upwards as viewed in FIGS. 6a-6d.

In the above-described exemplary semiconductor light-emitting device, light emitted from the LED chip can be wavelength-converted with the phosphor layer and a different colored light from that of the LED chip can be emitted via the phosphor layer towards the outside. The phosphor layer can be a transparent silicone mixed with a phosphor, and the light-reflecting resin can be a fundamental resin such as a silicone mixed with at least one of particles of titanium oxide, $SiO_2$, $Al_2O_3$ and AlN. In addition, the light-reflecting resin can be disposed on the light-emitting surface exposed around the chip electrode so as to contact a surface of the phosphor layer toward the chip electrode and can cover the bonding wire in order to encapsulate the bonding wire.

According to the exemplary semiconductor light-emitting device, the light-reflecting resin can prevent the LED chip from leak of light caused from the light-emitting surface being exposed between the phosphor layer and the chip electrode by covering the light-emitting surface exposed around the chip electrode therewith. The light-reflecting resin can also result in improving the brightness of the semiconductor light-emitting device by passing the leak of light through the phosphor layer. In addition, the semiconductor light-emitting device can protect the bonding wire from peeling that may be caused by environmental elements such as vibration, shock and the like by covering the chip electrode including both a wire bonding portion and the bonding wire with the light-reflecting resin.

According to another of the aspects of the disclosed subject matter, a semiconductor light-emitting device can include: a substrate including a chip-mounting surface and device electrodes, and the device electrodes located on the chip-mounting surface; a blue LED chip including a light-emitting surface and a chip electrode, and located on the chip-mounting surface of the substrate, and the chip electrode located on the light-emitting surface thereof; a phosphor layer being a transparent silicone mixed with a yellow phosphor, and located on the light-emitting surface except for the chip electrode of the LED chip; a bonding wire connecting the chip electrode to one of the device electrodes of the substrate; and a light-reflecting resin disposed at least on the light-emitting surface exposed between the chip electrode and the phosphor layer, on the chip electrode including the bonding wire, and on the one of the device electrodes including the bonding wire.

In the above-described exemplary semiconductor light-emitting device, light emitted from the blue LED can be converted into light having an approximately white color tone via the phosphor layer. The light-reflecting resin can be a fundamental resin mixed with at least one of particles of titanium oxide, $SiO_2$, $Al_2O_3$ and AlN, and the fundamental resin of the light-reflecting resin can be a silicone. In addition, the semiconductor light-emitting device can also include an encapsulating resin that is disposed around the blue LED chip including both the phosphor layer and the light-reflecting resin so as to encapsulate the blue LED chip and the bonding wire on the substrate. The silicone of the encapsulating resin can have a higher hardness than that of the fundamental resin of the light-reflecting resin.

According to the exemplary semiconductor light-emitting device, the semiconductor light-emitting device can emit a bright white light without substantial color variability using the above-described structure of a device in comparison with a conventional device, and can maintain a high reliability under exposure to vibration and shock while employing a simple structure.

BRIEF DESCRIPTION OF THE DRAWINGS

The above and other characteristics and features of the disclosed subject matter will become clear from the following description with reference to the accompanying drawings, wherein:

FIGS. 6a to 6d are schematic cross-section views depicting the effect of exemplary semiconductor light-emitting devices made in accordance with the principles of the disclosed subject matter, wherein FIG. 6a shows Embodiment 1 of the disclosed subject matter, and FIGS. 6b to 6d show Comparative Examples 1, 2 and 3, respectively.

FIG. 7c shows optical characteristics thereof.

FIG. 8 is a table showing each changing rate of luminous flux in the semiconductor light-emitting devices of Embodiment 1, Comparative Example 2 and Comparative Example 3.

DETAILED DESCRIPTION OF EXEMPLARY EMBODIMENTS

Exemplary embodiments of the disclosed subject matter will now be described in detail with reference to FIGS. 4-9.

Figure 1:
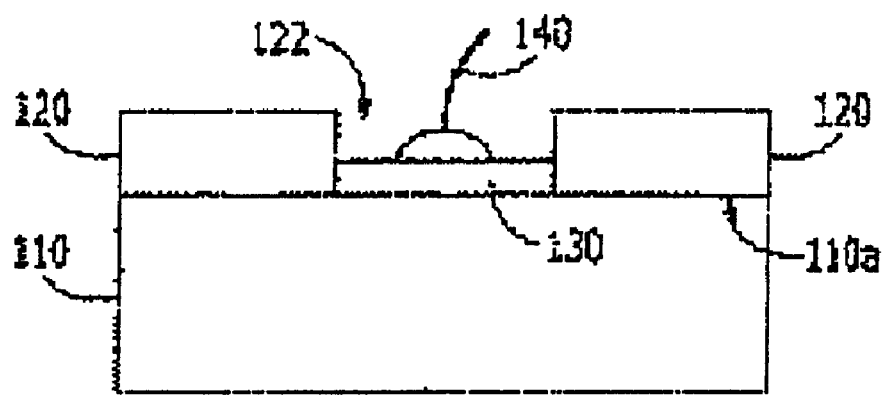
FIG. 1 is a schematic cross-section view showing a conventional semiconductor light-emitting device.
Figure 2:
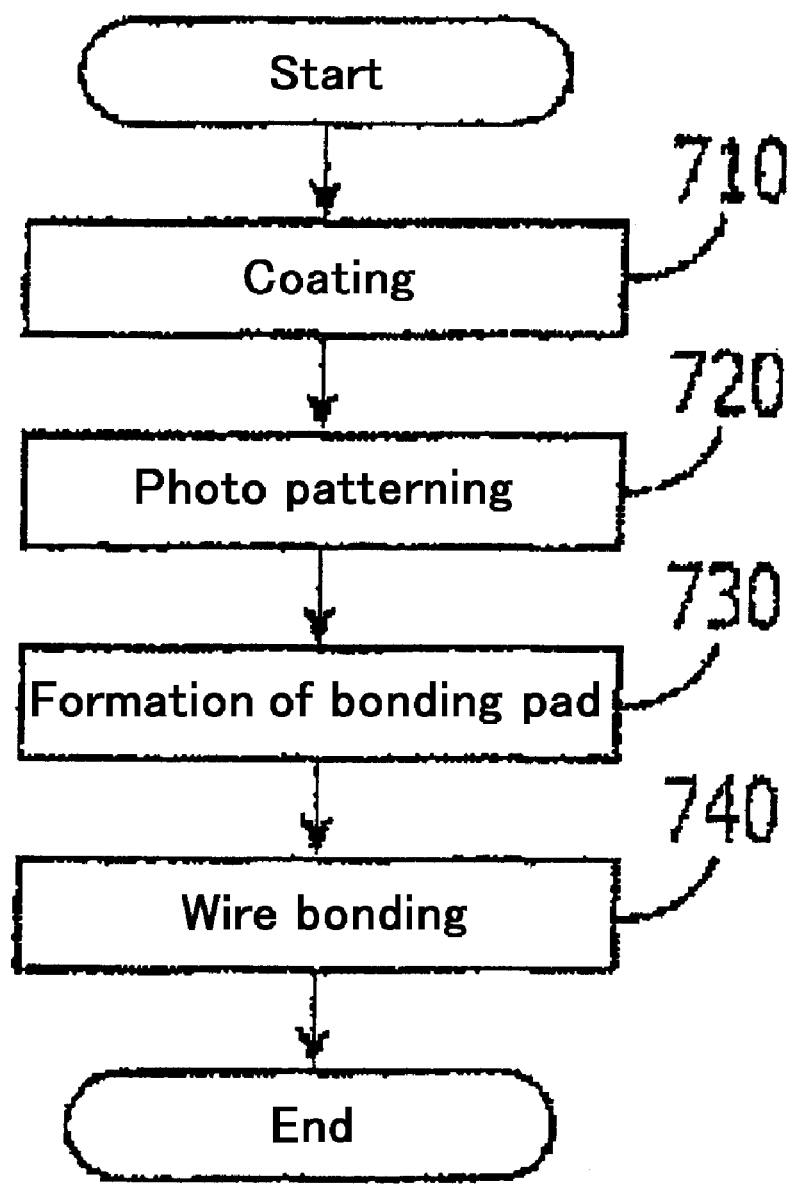
FIG. 2 is a flow chart showing a manufacturing process for the conventional semiconductor light-emitting device.
Figure 3:
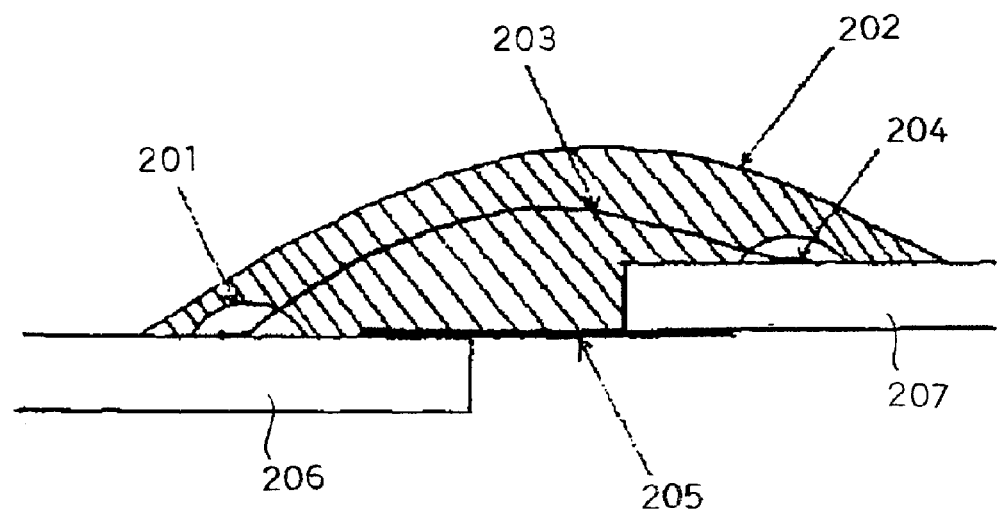
FIG. 3 is a cross-section view showing a conventional structure for protecting a bonding wire from vibration and shock.
Figure 4A:
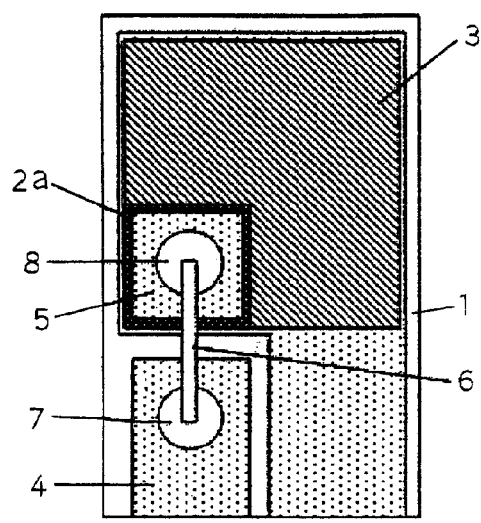
FIGS. 4a and 4b are schematic top and side views, respectively, showing an example of a semiconductor light-emitting device made in accordance with principles of the disclosed subject matter and which provides a light-emitting surface with a phosphor layer.
Figure 4B:
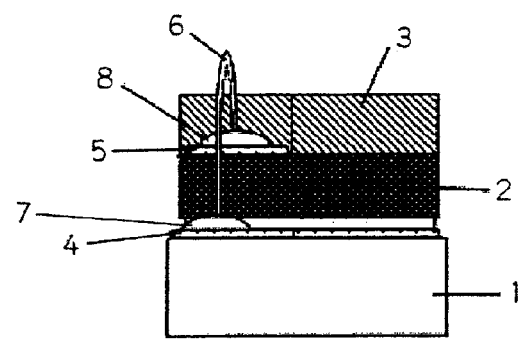

FIGS. 4a and 4b are schematic top and side views, respectively, showing a semiconductor light-emitting device that includes a light-emitting surface having an LED chip with a phosphor layer. The semiconductor light-emitting device can include: a substrate 1 having a chip-mounting surface; a device electrode 4 formed on the chip-mounting surface of the substrate 1; an LED chip 2 including a chip electrode 5 on a light-emitting surface thereof; a phosphor layer 3 on the chip-mounting surface of the LED chip 2 except for the portion of the surface that includes the chip electrode 5; and a bonding wire 6 connecting a wire bonding portion 8 on the chip electrode 5 to a wire bonding portion 7 on the device electrode 4.

In this case, for example, a blue chip that is composed of GaN can be used as the LED chip 2, and a yellow phosphor that is composed of YAG (e.g. YAG: Ce, $(Ca, Sr, Ba)_2SiO_4$: Eu) can be used for the phosphor layer 3. The blue LED chip can emit a blue light with a peak wavelength of 450 nm, and the yellow phosphor can convert blue light to a complementary yellow light. A part of the blue light emitted from the blue LED chip can excite the yellow phosphor and can convert it to yellow light, which can be mixed with other parts of the blue light emitted from the blue LED chip by means of additive color mixture. Thus, the semiconductor light-emitting device can emit light having an approximately white color tone.

However, in the exemplary semiconductor light-emitting device shown in FIGS. 4a-4b, a light-emitting surface 2a that is not covered with the phosphor layer 3, including a portion close to the chip electrode 5 on the light-emitting surface, is exposed to the outside. Therefore, a light that is emitted from the LED chip 2 and that does not pass through the phosphor layer 3 is directly emitted from the light-emitting surface 2a located close to the chip electrode 5 on the light-emitting surface (between the phosphor layer 3 and the chip electrode 5), and the direct light that is emitted from this exposed portion may cause a color variability in the white light tone emitted from the device.

Figure 5A:
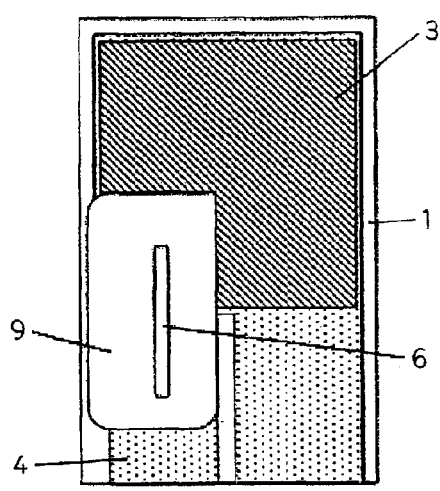
FIGS. 5a and 5b are top and side views showing an exemplary structure of a semiconductor light-emitting device made in accordance with principles of the disclosed subject matter, respectively.
Figure 5B:
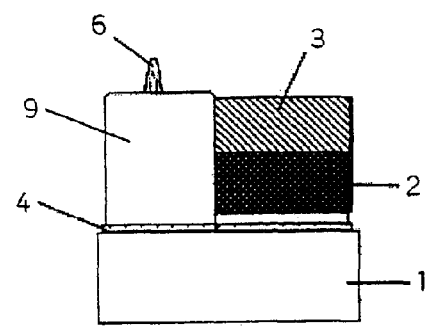

FIGS. 5a and 5b are respectively top and side views showing an exemplary semiconductor light-emitting device made in accordance with principles of the disclosed subject matter, wherein the same and similar elements as those shown in FIGS. 4a, 4b are marked with the same reference numerals as those in FIGS. 4a, 4b. In the semiconductor light-emitting device of FIGS. 5a-5b, a light-reflecting resin 9 can cover the light-emitting surface 2a exposed between the phosphor layer 3 and the chip electrode 5, the chip electrode 5 including both the wire bonding portion 8 and the bonding wire 6, and the device electrode 4 including both the wire bonding portion 7 and the bonding wire 6. It should be noted that certain features, such as the chip electrode 5 and wire bonding portions 7 and 8 cannot be seen in FIGS. 5a-5b because they are covered by the light-reflecting resin 9. However, these features can be similar or identical to those shown in FIGS. 4a-b.

The light-reflecting resin 9 can be a mixture of resin that includes a fundamental resin such as a thermosetting silicone resin with particles of at least one of titanium oxide, $SiO_2$, $Al_2O_3$, AlN. The silicone can be used as the fundamental resin because silicone may not be damaged by a thermal stress, ultraviolet rays and so on. The at least one particle that is mixed with the fundamental resin can effectively reflex the leak of light into the LED chip 2.

The disclosed subject matter includes a semiconductor light-emitting device that can prevent the LED chip 2 from exhibiting leakage of light emitted from the LED chip 2 that is not wavelength-converted and can prevent a decrease of brightness by covering certain portions of the device with the light-reflecting resin 9, which portions can include: the light-emitting surface 2a that is exposed between the phosphor layer 3 and the chip electrode 5; the chip electrode 5 including both the wire bonding portion 8 and the bonding wire 6; and the device electrode 4 including both the wire bonding portion 7 and the bonding wire 6. In addition, the semiconductor light-emitting device can prevent the bonding wire 6 from peeling from the device electrode 4 and the chip electrode 5, which can be caused by vibration and shock.

Figure 6A:
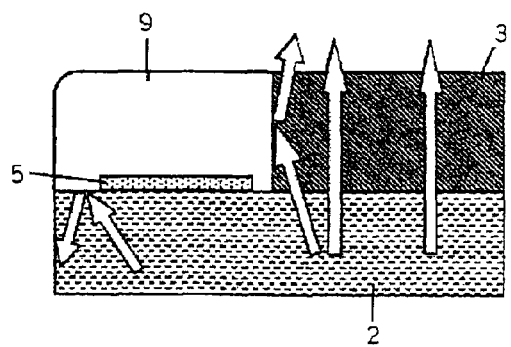
Figure 6B:
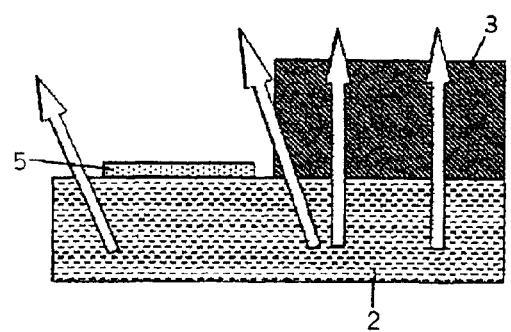
Figure 6C:
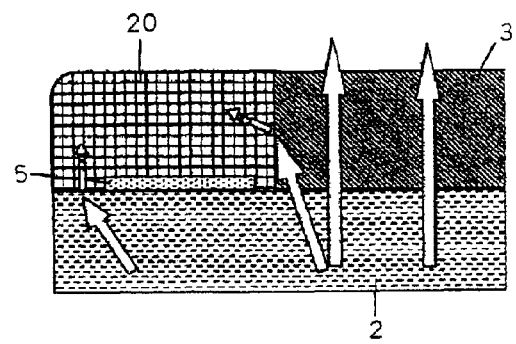
Figure 6D:
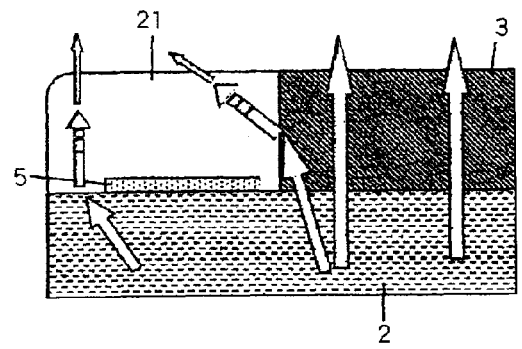

FIG. 6a is a schematic cross-section view depicting a light-emitting pathway in the semiconductor light-emitting device of the disclosed subject matter shown in FIGS. 5a and 5b. FIGS. 6b to 6d are schematic cross-section views depicting light-emitting pathways in semiconductor light-emitting devices of Comparative Examples 1, 2 and 3, respectively. More specifically, the semiconductor light-emitting device of FIG. 6b is not provided with the light-reflecting resin 9, and the semiconductor light-emitting devices of FIGS. 6c, 6d are respectively provided with a black absorbing material 20 and a transparent resin 21, which replaced the light-reflecting resin 9 of FIG. 6a. The bonding wire 6 is not shown in FIGS. 6a to 6d for convenience of explanation.

The light-reflecting resin 9 will now be described with reference to FIG. 6a. When light emitted from the LED chip 2 gets to a boundary surface of the light-reflecting resin 9 in the semiconductor light-emitting device, the light may not enter into the light-reflecting resin 9 but may be reflected from the boundary surface into the LED chip 2. Thus, the light-reflecting resin 9 can prevent leakage of light from the LED chip 2 that is not wavelength-converted from being emitted towards the outside.

In addition, light that gets to a boundary surface between the light-reflecting resin 9 and the phosphor layer 3 can also be reflected on the boundary surface. In this case, the brightness of the semiconductor light-emitting device is not decreased because the above reflex (or reflected) lights can be emitted to the outside along with the light that passes through the phosphor layer 3, and because light emitted from the LED chip 2 passes through the phosphor layer 3 with confidence.

However, because the semiconductor light-emitting device of FIG. 6b is not provided with the light-reflecting resin 9, the above-described reflex lights may not be generated on the boundary surfaces. Therefore, because the leakage of light emitted from the LED chip 2 may be emitted from the light-emitting surface 2a exposed between the phosphor layer 3 and the chip electrode 5 to the outside, the light that passes through the phosphor layer 3 may be decreased in comparison with the semiconductor light-emitting device of FIG. 6a.

When a light emitted from the LED chip 2 gets to a boundary surface of a black absorbing material 20 in the semiconductor light-emitting device shown in FIG. 6c, the light may enter into the black absorbing material 20 and may not be emitted to the outside because the light can be perfectly absorbed in the black absorbing material 20. Therefore, the black absorbing material 20 can prevent the LED chip 2 from exhibiting leakage of light that is not wavelength-converted from the light-emitting surface 2a exposed between the phosphor layer 3 and the chip electrode 5. However, the brightness of the semiconductor light-emitting device may be decreased because the above-described reflex lights are absorbed in the black absorbing material 20.

After light emitted from the LED chip 2 gets to a boundary surface of a transparent resin 21 in the semiconductor light-emitting device shown in FIG. 6d, the light may enter into the transparent resin 21. A part of the light may be absorbed in the transparent resin 21 but most of the light may be emitted from the LED chip 2 to the outside. Therefore, the transparent resin 21 may not prevent the LED chip 2 from exhibiting leakage of light that is not wavelength-converted from the light-emitting surface 2a exposed between the phosphor layer 3 and the chip electrode 5, and may also decrease the brightness of the semiconductor light-emitting device because the light passing through the phosphor layer 3 is smaller than that of the semiconductor light-emitting device shown in FIG. 6a of the disclosed subject matter.

As described above, the semiconductor light-emitting device of the disclosed subject matter can prevent the LED chip 2 from exhibiting leakage of light that is not wavelength-converted from the light emitted from the LED chip 2. In addition, the brightness of the emitted light can be maintained (and not decreased). The device including LED chip 2 can also be configured to prevent the bonding wire 6 from peeling in the wire bonding portions 7 and 8, which may otherwise be caused by vibration and shock.

Embodiment 1 of the disclosed subject matter will now be described more specifically and in comparison with Comparative Examples 1, 2 and 3 of the disclosed subject matter.

Embodiment 1

In Embodiment 1 of the semiconductor light-emitting device, a blue LED chip having a length of 980 micro meters can be located on the substrate 1, which is composed of a ceramic. The phosphor layer 3 including a yellow phosphor can be formed with a thickness of 200 micro meters on a light-emitting surface of the blue LED chip opposite the substrate 1 using a stencil printing (metallic mask printing).

In the stencil printing process, a phosphor dispersing liquid that includes a thermal setting silicone mixed with a YAG phosphor of 27 wt percent of the thermal setting silicone and a fumed silica of 13 wt percent for the purpose of an adjustment of viscosity can be used as the phosphor layer 3 and can be printed using a stencil of stainless having a thickness of 200 micro meters. The thickness of the phosphor layer 3 can be determined by the substantial thickness of the metallic mask. After printing the phosphor dispersing liquid, it can be heated for two hours at 150 degrees centigrade and can be solidified. Then, the chip electrode 5 of the light-emitting surface can be bonded via the bonding wire 6 that is composed of gold.

In addition, the light-reflecting resin 9 can be dispensed by a dispenser so that the light-emitting surface 2a exposed between the phosphor layer 3 and the chip electrode 5, the chip electrode 5 including both the wire bonding portion 8 and the bonding wire 6, and the device electrode 4 including both the wire bonding portion 7 and the bonding wire 6 can be covered with the light-reflecting resin 9. A mixture resin that includes a thermal setting silicone mixed with particle(s) of titanium oxide by a revolved defoaming apparatus can be used as the light-reflecting resin 9.

Comparative Example 1

In Comparative Example 1 of the semiconductor light-emitting device, the blue LED chip having a length of 980 micro meters is located on the substrate 1 that is composed of a ceramic. The phosphor layer 3 including the yellow phosphor is formed with a thickness of 200 micro meters on the light-emitting surface of the blue LED chip opposite the substrate 1 using the stencil printing (metallic mask printing).

In the stencil printing process, the phosphor dispersing liquid that includes a thermal setting silicone mixed with the YAG phosphor of 27 wt percent of the thermal setting silicone and the fumed silica of 13 wt percent for the purpose of the adjustment of viscosity is used as the phosphor layer 3 and is printed using the stencil of stainless having a thickness of 200 micro meters. The thickness of the phosphor layer 3 can be determined by the substantial thickness of the metallic mask. After printing the phosphor dispersing liquid, it is heated at 150 degrees centigrade for two hours and is solidified. Then, the chip electrode of the light-emitting surface is bonded via a gold bonding wire.

In addition, the light-emitting surface 2a exposed between the phosphor layer 3 and the chip electrode 5, the chip electrode 5 including both the wire bonding portion 8 and the bonding wire 6, and the device electrode 4 including both the wire bonding portion 7 and the bonding wire 6 are not provided with the light-reflecting resin 9, and they are exposed to the outside.

Comparative Example 2

In Comparative example 2 of the semiconductor light-emitting device, the blue LED chip having a length of 980 micro meters is located on the substrate 1 that is composed of a ceramic. The phosphor layer 3 including the yellow phosphor can be formed with a thickness of 200 micro meters on the light-emitting surface of the blue LED chip opposite the substrate 1 using the stencil printing (metallic mask printing).

In the stencil printing process, the phosphor dispersing liquid that includes the thermal setting silicone mixed with the YAG phosphor of 27 wt percent of the thermal setting silicone and the fumed silica of 13 wt percent for the purpose of the adjustment of viscosity can be used as the phosphor layer and can be printed using the stencil of stainless having a thickness of 200 micro meters. The thickness of the phosphor layer 3 can be determined by the substantial thickness of the metallic mask. After printing the phosphor dispersing liquid, it can be heated for two hours at 150 degrees centigrade and can be solidified. Then, the chip electrode of the light-emitting surface is bonded via the gold bonding wire.

In addition, the light-emitting surface 2a exposed between the phosphor layer 3 and the chip electrode 5, the chip electrode 5 including both the wire bonding portion 8 and the bonding wire 6, and the device electrode 4 including both the wire bonding portion 7 and the bonding wire 6 are provided with the black absorbing material 20. A material of G8354 made by Namics Corporation is used as the black absorbing material 20.

Comparative Example 3

In Comparative example 3 of the semiconductor light-emitting device, the blue LED chip having a length of 980 micro meters is located on the substrate 1 that is composed of a ceramic. The phosphor layer 3 including the yellow phosphor is formed with a thickness of 200 micro meters on the light-emitting surface of the blue LED chip opposite the substrate 1 using the stencil printing (metallic mask printing).

In the stencil printing process, the phosphor dispersing liquid includes the thermal setting silicone mixed with the YAG phosphor of 27 wt percent of the thermal setting silicone and the fumed silica of 13 wt percent for the purpose of the adjustment of viscosity is used as the phosphor layer 3 and is printed using the stencil of stainless having a thickness of 200 micro meters. The thickness of the phosphor layer is determined by the substantial thickness of the metallic mask. After printing the phosphor dispersing liquid, it is heated for two hours at 150 degrees centigrade and is solidified. Then, the chip electrode 5 of the light-emitting surface is bonded via the gold bonding wire.

In addition, the transparent resin 21 is dispensed by a dispenser so as to cover the light-emitting surface 2a exposed between the phosphor layer 3 and the chip electrode 5, the chip electrode 5 including both the wire bonding portion 8 and the bonding wire 6, and the device electrode 4 including both the wire bonding portion 7 and the bonding wire 6, with the transparent resin 21. Two liquid thermosetting silicone resins can be used as the transparent resin 21.

In Embodiment 1, Comparative Example 2 and Comparative Example 3, each can include the above-described resins for both preventing the leakage of blue light and for providing a protecting effect in which peeling of the bonding wire 6 can be prevented, respectively. When the phosphor layer 3 is printed using the stencil printing after forming the chip electrode 5 on the blue LED chip, if the phosphor liquid is located so as to cover a boundary between the light-emitting surface of the blue chip and the chip electrode 5, the phosphor layer 3 may protrude on the electrode chip 5.

In this case, the intensity of wire bonding may be reduced in the wire bonding process, and the reduction of the intensity of wire bonding may cause a decrease in the reliability of the LED chip. Therefore, the phosphor layer 3 is located on the light-emitting surface so as not to contact to the chip electrode 5. However, the space between the phosphor layer 3 and the light-emitting surface may cause the leak of blue light. According to the disclosed subject matter, the leak of blue light can be prevented by covering at least a portion of the light-emitting surface that is exposed around the chip electrode 5 with the light-reflecting resin 9 while maintaining the reliability of wire bonding with the light-reflecting resin 9.

Figure 7A:
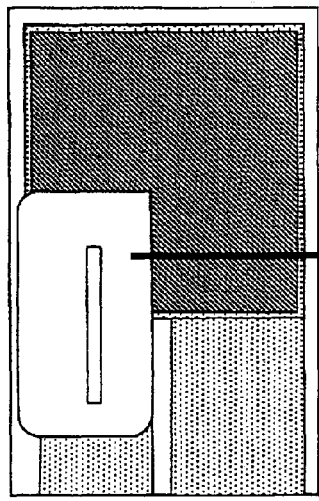
FIGS. 7a to 7c are schematic top side views and a graph showing the improvement effect of a leak of blue light of an exemplary semiconductor light-emitting device made in accordance with the principles of the disclosed subject matter, wherein FIGS. 7a and 7b respectively show measuring portions of the semiconductor light-emitting device matter and a comparative device.
Figure 7B:
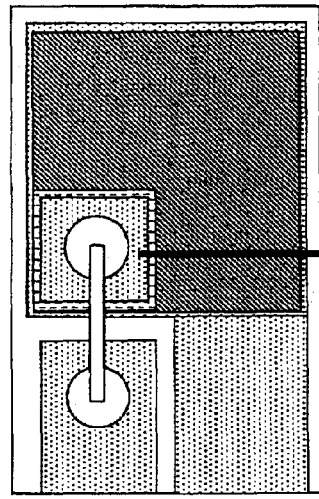
Figure 7C:
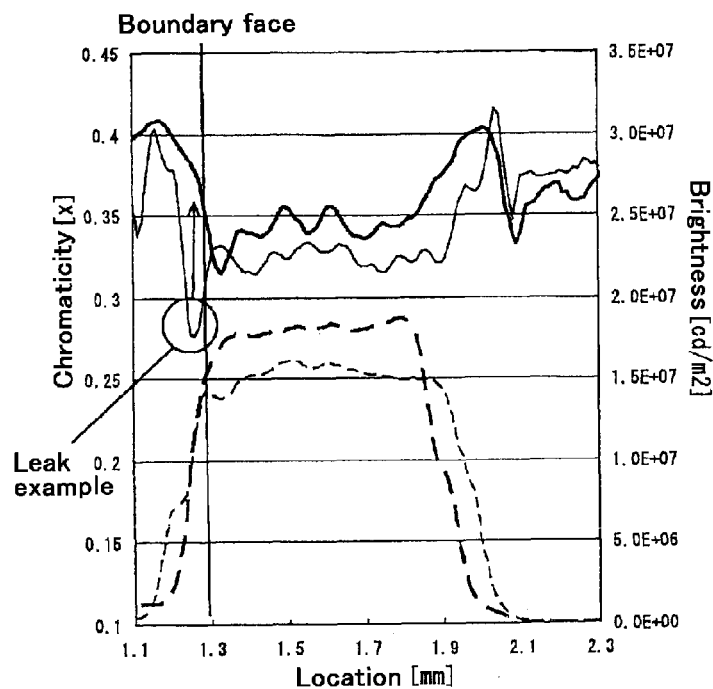

FIGS. 7a to 7c are schematic top side views and a graph showing the improvement effects related to leakage of blue light of the semiconductor light-emitting device of the disclosed subject matter, wherein FIGS. 7a and 7b respectively show a measuring portion for the semiconductor light-emitting device of Embodiment 1 of the disclosed subject matter and Comparative Example 1, and FIG. 7c shows optical characteristics thereof. In FIG. 7c, the x axis shows the respective same locations of the measuring portions of Embodiment 1 and Comparative Example 1, and the y axis shows the related chromaticity and brightness.

In Embodiment 1, the chromaticity may be relatively flat, however, the leak of blue light that is marked as "Leak example" is shown at a line close to the boundary face between the phosphor layer 3 and the chip electrode 5 in Comparative Example 1. With respect to the brightness, the brightness of Embodiment 1 can be higher than that of Comparative Example 1.

FIG. 8 is a table showing the changing rate of luminous flux in the semiconductor light-emitting devices of Embodiment 1, Comparative Example 2 and Comparative Example 3. When covering the portion of the light-emitting surface 2a that is exposed between the phosphor layer 3 and the chip electrode 5 with the black absorbing material 20 as in Comparative Example 2, because a part of the light emitted from the LED chip 2 is absorbed into the absorbing material 20, the luminous flux of the LED chip 2 is largely decreased.

When covering the portion of the light-emitting surface 2a that is exposed between the phosphor layer 3 and the chip electrode 5 with the transparent resin 21 as in Comparative Example 3, because a part of the light emitted from the LED chip 2 is reflected and absorbed in the transparent resin 21, the luminous flux of the LED chip 2 is also decreased. However, when covering the portion of the light-emitting surface 2a that is exposed between the phosphor layer 3 and the chip electrode 5 with the light-reflecting resin 9 as in Embodiment 1, the decrease of the luminous flux may be suppressed because the light emitted from the LED chip 2 can be reflected on the boundary surface of the light-reflecting resin 9 into the LED chip 2.

Figure 9:
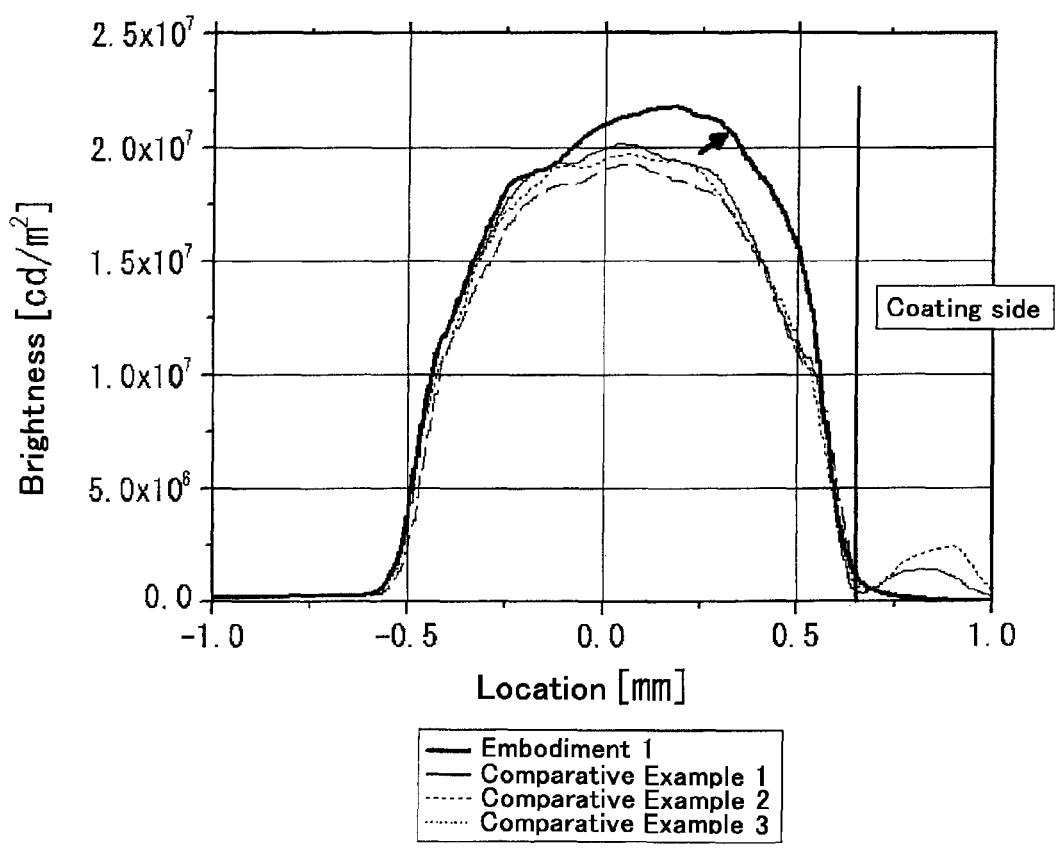
FIG. 9 is a graph showing each exemplary brightness distribution of the semiconductor light-emitting devices of Embodiment 1, Comparative Example 1, Comparative Example 2 and Comparative Example 3.

FIG. 9 is a graph showing an exemplary brightness distribution for each of the semiconductor light-emitting devices of Embodiment 1, Comparative Example 1, Comparative Example 2 and Comparative Example 3. The semiconductor light-emitting device of Embodiment 1 can result in improving the brightness by approximately ten percent in comparison with Comparative Examples 1, 2 and 3, because the light reflected on the boundary surface of the light-reflecting resin 9 can be emitted from the phosphor layer 3 towards the outside.

The following results can be confirmed from the above-described experiment. The semiconductor light-emitting device can protect the bonding wire 6 from the effect of peeling by covering the chip electrode 5 including both the wire bonding portion 8 and the bonding wire 6, and the device electrode 4 including both the wire bonding portion 7 and the bonding wire 6, with the light-reflecting resin 9.

The light-reflecting resin 9 can prevent the LED chip 2 from exhibiting leakage of blue light caused from the light-emitting surface 2a being exposed between the phosphor layer 5 and the chip electrode 5. In this case, a decrease in the luminous flux of the LED chip 2 can be prevented, and the bonding wire 6 can be protected with the light-reflecting resin 9. In addition, the light-reflecting resin 9 can also allow the LED chip 2 to exhibit improvements in the brightness thereof.

The above-described embodiment includes a blue LED chip used as the LED chip 2 and a phosphor layer 3 which includes yellow phosphor. However, the LED chip 2 is not limited to the blue LED chip but can be other colored LED chips. The phosphor is also not limited to the yellow phosphor but can be various other wavelength-converting phosphors, provided the light emitted from the LED chip 2 can be wavelength-converted with the particular phosphor layer 3.

In addition, in the above-described embodiment, the use of one LED chip mounted on one substrate is described. However, a plurality of LED chips can be used on the substrate or substrates. With respect to the light-reflecting resin 9, the above description contemplates that the following portions of the device can be covered with the light-reflecting resin 9: the portion of the light-emitting surface 2a that is exposed between the phosphor layer 5 and the chip electrode 5; the chip electrode 5 including both the wire bonding portion 8 and the bonding wire 6; and the device electrode 4 including both the wire bonding portion 7 and the bonding wire 6.

However, the light-reflecting resin 9 can also cover at least a portion of the light-emitting surface 2a that is exposed between the phosphor layer 3 and the chip electrode 5 therewith, and also an encapsulating resin can be disposed around the LED chip 2 including the phosphor layer 3 and the light-reflecting resin 9 so as to encapsulate the LED chip 2 including the bonding wire 6 on the substrate 1. In this case, the semiconductor light-emitting device can be protected from external environment conditions such as humidity, shock, dirt, dust and the like with confidence.

A silicone can be employed as the encapsulating resin and can be a silicone that may not be damaged by ultraviolet rays. However, because a soft silicone may easily attract dirt and dust thereto, the soft silicone can be used as the fundamental resin of the light-reflecting resin 9 in order to protect the bonding wire 6 with more confidence, and a hard silicone that prevents attachment by dirt and dust thereto can be employed as the encapsulating resin.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A semiconductor light-emitting device, comprising:
    an LED chip including a light-emitting surface configured to emit light in a light emitting direction and a chip electrode, and the chip electrode located adjacent the light-emitting surface;
    a phosphor layer located on the light-emitting surface, wherein a portion of the light-emitting surface is exposed between the chip electrode and the phosphor layer as viewed from the light emitting direction;
    a bonding wire connected to the chip electrode of the LED chip;
    a light-reflecting resin having a boundary surface disposed at least on the portion of the light-emitting surface exposed between the chip electrode and the phosphor layer, and the light-reflecting resin configured to reflect light emitted from the portion of the light-emitting surface from the boundary surface of the light-reflecting resin into the LED chip and therefore configured to prevent the LED chip from exhibiting leakage of light from the portion of the light-emitting surface that is exposed and which is not wavelength-converted by the phosphor layer, wherein light emitted from the LED chip when the device is operated is wavelength-converted by the phosphor layer and a different colored light is emitted from the device as compared to a color of light emitted by the LED chip.

2. The semiconductor light-emitting device according to claim 1, wherein the phosphor layer includes a transparent silicone mixed with a phosphor.

3. The semiconductor light-emitting device according to claim 1, wherein the light-reflecting resin includes a fundamental resin mixed with particles of at least one of titanium oxide, $SiO_2$, $Al_2O_3$ and AlN.

4. The semiconductor light-emitting device according to claim 2, wherein the light-reflecting resin includes a fundamental resin mixed with particles of at least one of titanium oxide, $SiO_2$, $Al_2O_3$ and AlN.

5. The semiconductor light-emitting device according to claim 3, wherein the fundamental resin of the light-reflecting resin is a silicone.

6. The semiconductor light-emitting device according to claim 4, wherein the fundamental resin of the light-reflecting resin is a silicone.

7. A semiconductor light-emitting device, comprising:
an LED chip including a light-emitting surface configured to emit light in a light emitting direction and a chip electrode, and the chip electrode located adjacent the light-emitting surface;
a phosphor layer located on the light-emitting surface except for a portion of the light-emitting surface exposed around the chip electrode as viewed from the light emitting direction;
a bonding wire connected to the chip electrode of the LED chip;
a light-reflecting resin having a boundary surface disposed on the portion of the light-emitting surface exposed around the chip electrode while contacting the phosphor layer and covering the bonding wire, wherein the light-reflecting resin is configured to reflect light emitted from the portion of the light-emitting surface from the boundary surface of the light-reflecting resin into the LED chip and therefore is configured to prevent the LED chip from exhibiting leakage of light from the portion of the light-emitting surface that is exposed and which is not wavelength-converted by the phosphor layer, and light emitted from the LED chip when the device is operated is wavelength-converted by the phosphor layer and a different colored light is emitted from the device as compared to a color of light emitted by the LED chip.

8. The semiconductor light-emitting device according to claim 7, wherein the phosphor layer includes a transparent silicone mixed with a phosphor, and the light-reflecting resin includes a silicone mixed with particles of at least one of titanium oxide, $SiO_2$, $Al_2O_3$ and AlN.

9. A semiconductor light-emitting device, comprising:
a substrate including a chip-mounting surface and device electrodes, and the device electrodes being located adjacent the chip-mounting surface;
a blue LED chip including a light-emitting surface configured to emit light in a light emitting direction and a chip electrode, the blue LED chip located adjacent the chip-mounting surface of the substrate, and the chip electrode located on at least a portion of the light-emitting surface;
a phosphor layer including a transparent silicone mixed with a yellow phosphor, and located on the light-emitting surface except for the portion of the light-emitting surface at which the chip electrode of the blue LED chip is located, wherein another portion of the light-emitting surface is exposed between the chip electrode and the phosphor layer as viewed from the light emitting direction;
a bonding wire connecting the chip electrode of the blue LED chip to one of the device electrodes of the substrate;
a light-reflecting resin disposed at least on the other portion of the light-emitting surface exposed between the chip electrode and the phosphor layer, on the chip electrode including the bonding wire, and on the one of the device electrodes including the bonding wire, wherein
light emitted from the blue LED chip is converted into light having an approximately white color tone via the phosphor layer.

10. The semiconductor light-emitting device according to claim 9, wherein the light-reflecting resin includes a fundamental resin mixed with particles of at least one of titanium oxide, $SiO_2$, $Al_2O_3$ and AlN.

11. The semiconductor light-emitting device according to claim 10, wherein the fundamental resin of the light-reflecting resin is a silicone.

12. The semiconductor light-emitting device according to claim 9, further comprising:
an encapsulating resin disposed around the blue LED chip including both the phosphor layer and the light-reflecting resin so as to encapsulate the blue LED chip and the bonding wire on the substrate.

13. The semiconductor light-emitting device according to claim 12, wherein the light-reflecting resin includes a fundamental resin mixed with particles of at least one of titanium oxide, $SiO_2$, $Al_2O_3$ and AlN.

14. The semiconductor light-emitting device according to claim 13, wherein the fundamental resin of the light-reflecting resin is a silicone.

15. The semiconductor light-emitting device according to claim 12, wherein the encapsulating resin is a silicone.

16. The semiconductor light-emitting device according to claim 13, wherein the encapsulating resin is a silicone.

17. The semiconductor light-emitting device according to claim 14, wherein the encapsulating resin is a silicone.

18. The semiconductor light-emitting device according to claim 15, wherein the silicone of the encapsulating resin has a higher hardness than the hardness of the light-reflecting resin.

19. The semiconductor light-emitting device according to claim 16, wherein the silicone of the encapsulating resin has a higher hardness than the hardness of the fundamental resin of the light-reflecting resin.

20. The semiconductor light-emitting device according to claim 17, wherein the silicone of the encapsulating resin has a higher hardness than the hardness of the silicone of the fundamental resin of the light-reflecting resin.

* * * * *